(12) United States Patent
Hsu et al.

(10) Patent No.: US 8,981,415 B1
(45) Date of Patent: Mar. 17, 2015

(54) LIGHT EMITTING DIODE PACKAGE

(71) Applicant: Lextar Electronics Corporation, Hsinchu (TW)

(72) Inventors: Che-Ming Hsu, Dacheng Township (TW); Wen-Kai Shao, New Taipei (TW); Liang-Ta Lin, Guishan Township (TW)

(73) Assignee: Lextar Electronics Corporation, Hsinchu (TW)

(*) Notice: Subject to any disclaimer, the term of this patent is extended or adjusted under 35 U.S.C. 154(b) by 0 days.

(21) Appl. No.: 14/336,055

(22) Filed: Jul. 21, 2014

(30) Foreign Application Priority Data

Sep. 27, 2013 (TW) .............................. 102135095 A

(51) Int. Cl.
*H01L 33/00* (2010.01)
*H01L 33/50* (2010.01)
*H01L 33/56* (2010.01)

(52) U.S. Cl.
CPC .............. *H01L 33/504* (2013.01); *H01L 33/56* (2013.01)

USPC .................................. 257/98; 257/99; 257/100

(58) Field of Classification Search
USPC ........................................................ 257/98, 99
See application file for complete search history.

(56) References Cited

U.S. PATENT DOCUMENTS

| | | | | |
|---|---|---|---|---|
| 8,278,671 | B2* | 10/2012 | Jung et al. | 257/89 |
| 2007/0029668 | A1* | 2/2007 | Lin et al. | 257/723 |
| 2010/0163898 | A1* | 7/2010 | Hung et al. | 257/98 |
| 2011/0019707 | A1* | 1/2011 | Sato et al. | 372/45.01 |
| 2012/0024347 | A1* | 2/2012 | Lin et al. | 136/251 |
| 2012/0211780 | A1* | 8/2012 | Jung et al. | 257/89 |
| 2012/0235198 | A1* | 9/2012 | Cai et al. | 257/98 |

\* cited by examiner

*Primary Examiner* — Bilkis Jahan
(74) *Attorney, Agent, or Firm* — Moser Taboada

(57) ABSTRACT

A light-emitting diode (LED) package structure includes a lead frame, a LED chip, a package body, N opaque spacer and N+1 encapsulating glues. The LED chip is disposed on the lead frame; the package body covers the lead frame and exposes the LED chip. The package body has an accommodation space, divided by the N opaque spacers disposed on the LED chip into N+1 chambers. The N+1 encapsulating glues are filled into the N+1 chambers, where N is a natural number.

10 Claims, 3 Drawing Sheets

LIGHT EMITTING DIODE PACKAGE

RELATED APPLICATIONS

This application claims priority to Taiwan Application Serial Number 102135095, filed Sep. 27, 2013, which is herein incorporated by reference.

BACKGROUND

1. Field of Invention

The present invention relates to a light emitting diode package. More particularly, the present invention relates to a light emitting diode package which separates encapsulating glues.

2. Description of Related Art

A plastic leaded chip carrier (PLCC) light emitting diode package includes one or more light emitting diode chip in a package sealed with an encapsulating glue. With light emitting diode chips or phosphors of different color in the encapsulating glue, such as a blue light emitting diode chip form white light with yellow phosphors, the PLCC is able to emit a desired light color.

However, because the phosphors of different colors are all in the same accommodation space, light excited by the respective phosphors may be absorbed by another phosphor. Therefore a light absorbance effect may be observed between these phosphors configured to excite different color of light, which not only consumes energy but also lowers the color rendering index (CRI) value.

SUMMARY

Therefore, a light emitting diode package which can separate encapsulating glues is provided. The package provides various accommodation spaces to separate different kinds of encapsulating glues in a packaging process. The package let a wavelength transfer substance, for example, phosphor, may exist alone to prevent the energy consumption by the absorbance effect and have higher CRI value and brightness. Also, the package only use one light emitting diode chip, which can save costs and enhance a process fabricating convenience.

One aspect of the present disclosure is a light emitting diode package, including a lead frame comprising a die bonding area. A package body covering the lead frame and exposing part of the lead frame, wherein a top surface of the package body has an opening and an accommodation space concaved from the opening, wherein the accommodation space includes a bottom surface and a sidewall surrounding the bottom surface, and exposing the die bonding area of the lead frame on the bottom surface of the accommodation space. A light emitting diode chip emitting a first light in a wavelength $\lambda_1$ mounted on the die bonding area, and the light emitting diode chip having a light emitting surface facing the opening. N opaque spacers vertically spaced and across disposed in the light emitting surface of the light emitting diode chip, dividing the light emitting surface into N+1 parts and dividing the accommodation space into N+1 chambers, and the each of the chambers exposes a part of the light emitting surface of the light emitting diode chip. And N+1 encapsulating glues separately filling into each of the chamber, and the $i^{th}$ encapsulating glue comprising an $i^{th}$ wavelength converting material, wherein i and N are both natural numbers, and $1 \leq i \leq N+1$.

According to one embodiment of the present disclosure, wherein the $i^{th}$ wavelength converting material in the $i^{th}$ encapsulating glue and the $j^{th}$ wavelength converting material in the $j^{th}$ encapsulating glue belong to the same kind but different concentrations, wherein j is a natural number, and $1 \leq j \leq N+1$, but $i \neq j$.

According to one embodiment of the present disclosure, wherein the $i^{th}$ wavelength converting material in the $i^{th}$ encapsulating glue is different from a $j^{th}$ wavelength converting material in a $j^{th}$ encapsulating glue, wherein j is a natural number, and $1 \leq j \leq N+1$, but $i \neq j$.

According to one embodiment of the present disclosure, wherein each of the opaque spacer extends from the bottom surface of the accommodation space to the opening along the sidewall, such that the encapsulating glue in the neighboring chambers is not mixed to each other.

According to one embodiment of the present disclosure, wherein the opaque spacers comprises a silicone or an epoxy blended with the high reflectivity material.

According to one embodiment of the present disclosure, wherein the bottom surface and the sidewall also comprise the high reflectivity material.

According to one embodiment of the present disclosure, wherein the high reflectivity material is selected from the group consisting of titanium dioxide, silicon dioxide, aluminum oxide and combinations thereof.

According to one embodiment of the present disclosure, wherein the first light emitted by the light emitting diode chip, after passing through the $i^{th}$ chamber, is converted to a i+1th light in a wavelength i+1, in which $\lambda i+1 > \lambda_1$, by the $i^{th}$ wavelength converting material in the encapsulating glue in the $i^{th}$ chamber, to emit a plurality of fluorescence which is configured to be mixed to a white light.

According to one embodiment of the present disclosure, wherein the light emitting diode chip is an ultraviolet light emitting diode chip or a blue light emitting diode chip.

According to one embodiment of the present disclosure, the wavelength converting material is a phosphor, pigment, dye, or combinations thereof.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
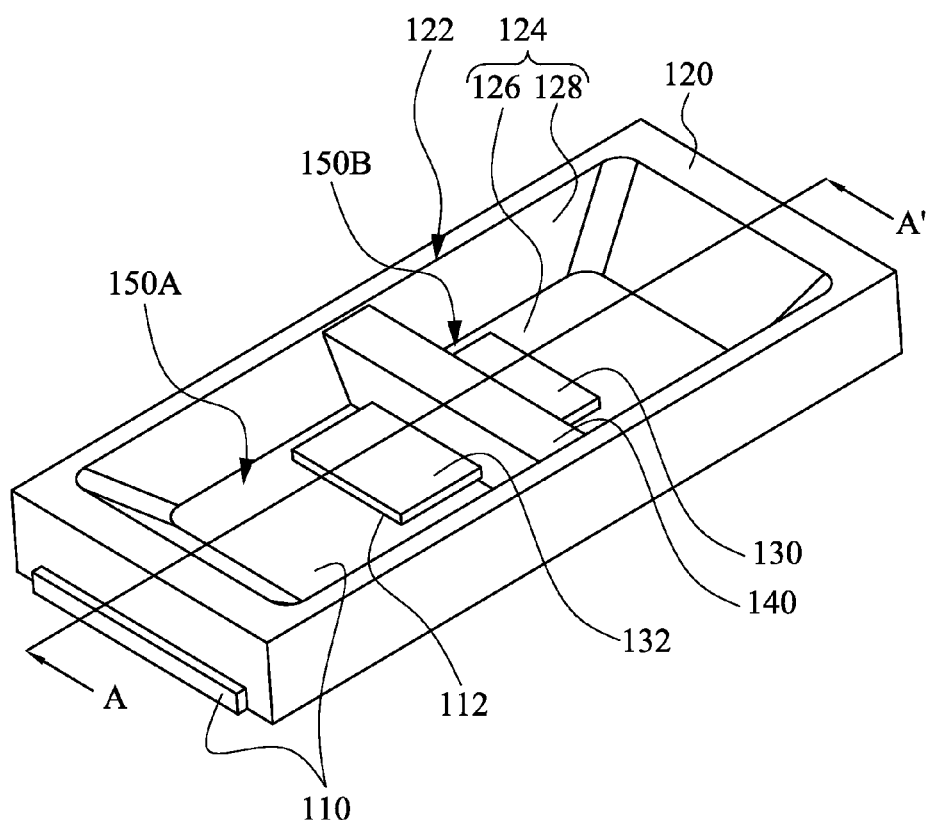
FIG. 1 is a stereogram of light emitting diode package.

Reference will now be made in detail to the present embodiments of the disclosure, examples of which are illustrated in the accompanying drawings. Wherever possible, the same reference numbers are used in the drawings and the description to refer to the same or like parts.

Referring to FIG. 1, FIG. 1 is a stereogram of light emitting diode package. As shown in FIG. 1, a light emitting diode package 100 includes a lead frame 110, a package body 120, a light emitting diode chip 130, and opaque spacers 140. More particularly, the light emitting diode package 100 includes a lead frame 110, a top surface of the lead frame 110 having a die bonding area 120. The lead frame 110 is covered by the package body 120, and exposed part of the lead frame 110 and the die bonding area 120 from the package body 120. A top surface of the package body 120 has an opening 122, and an accommodation space 124 concaved from the opening 122. The accommodation space includes a bottom surface 126 and a sidewall 128 surrounding the bottom surface 126. The die bonding area 112 is exposed on the bottom surface 126 of the accommodation space 124. A light emitting diode chip 130 is mounted on the die bonding area 112. The light emitting diode chip 130 has a light emitting surface 132 facing the opening 122 of the accommodation space 124, and can emit a first light in a wavelength $\lambda_1$. An opaque spacer 140 is vertically spaced and across disposed in the light emitting surface 132 of the light emitting diode chip 130. The opaque spacer 140 is vertically spaced and across disposed in the light emitting surface 132, dividing the light emitting surface 132 into two parts, and dividing the accommodation space 124 into a first chamber 150A and a second chamber 150B. Both chambers 150A, 150B expose part of the light emitting surface 132 of the light emitting diode chip 130.

More particularly, in one embodiment of the present disclosure, the opaque spacer 140 extends from the bottom surface 126 of the accommodation space 124 to the opening 122 along the sidewall 128, separating a encapsulating glue 160 in the neighboring chambers 150, making the different kinds of encapsulating glues not be mixed. The opaque spacer 140 includes a silicone or an epoxy blended with a high reflectivity material. The bottom surface 126 and the sidewall 128 also include the high reflectivity material. The high reflectivity material is selected from the group consisting of titanium dioxide, silicon dioxide, aluminum oxide and combinations thereof.

Figure 2:
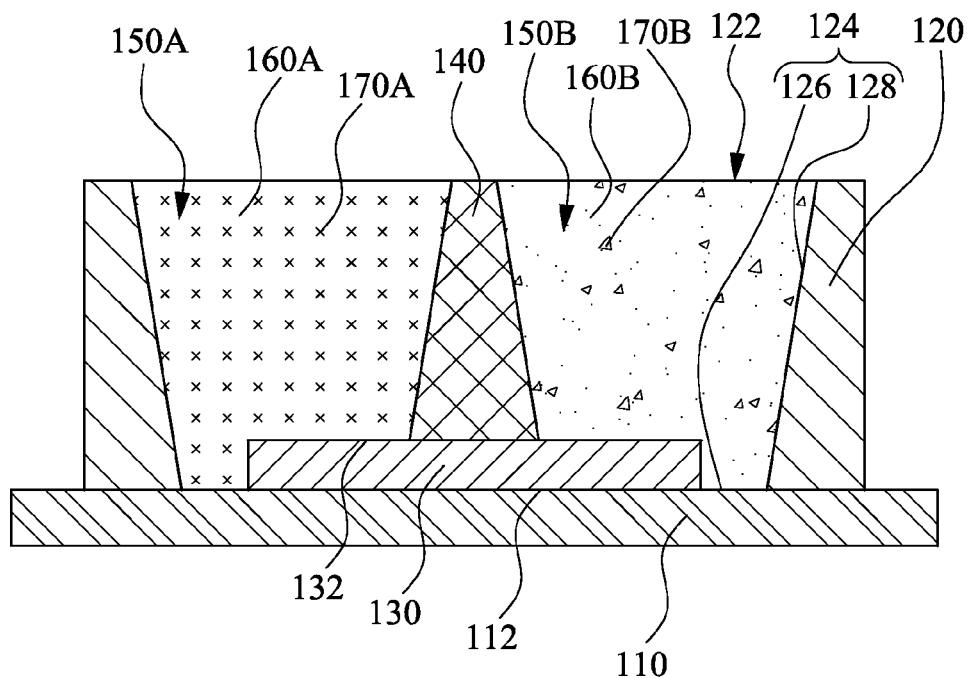
FIG. 2 is a schematic diagram of light emitting diode package.

FIG. 2 is referred to, or together with FIG. 1, for clearly understanding the present disclosure. FIG. 2 is the cross-section view of section line AA' of the light emitting diode package 100 in FIG. 1. As shown in FIG. 2, a first encapsulating glue 160A is filled into the first chamber 150A. The first encapsulating glue 160A includes a first wavelength converting material 170A. A second encapsulating glue 160B is filled into the second chamber 150B. The second encapsulating glue 160B includes a second wavelength converting material 170B. The first wavelength converting material 170A can convert the first light in the wavelength $\lambda_1$ emitted from the light emitting diode chip 130 into a second light in a wavelength $\lambda_2$. The second wavelength converting material 170B can convert the first light in the wavelength $\lambda_1$ emitted from the light emitting diode chip 130 into a third light in a wavelength $\lambda_3$. The second light and the third light can mix and form a white light. In one embodiment of the present disclosure, the light emitting diode chip 130 is a blue light emitting diode chip, the first wavelength converting material 170A is red phosphor, and the second wavelength converting material 170B is green phosphor. The light emitted from the light emitting diode chip is converted and mixed after passing through different chambers to form the white light. In one embodiment of the present disclosure, the light emitting diode chip 130 is a blue light emitting diode chip, red light emitting diode chip, green light emitting diode chip, or the ultraviolet light emitting diode chip. The wavelength converting material is phosphor, pigment, dye, and/or combinations thereof.

Figure 3:
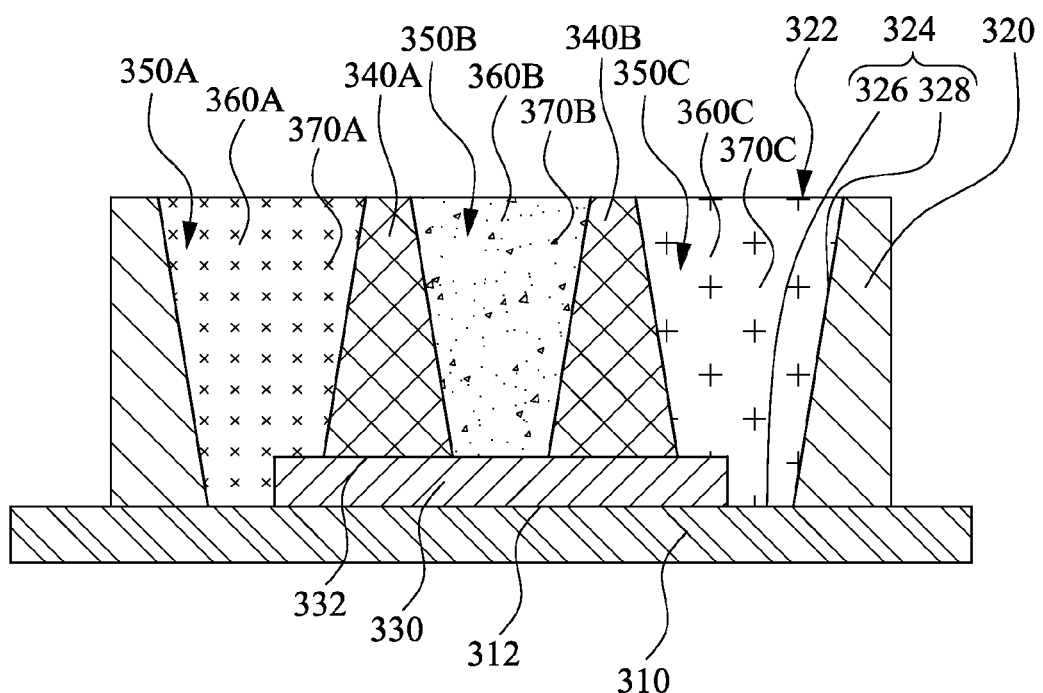
FIG. 3 is a schematic diagram of light emitting diode package.

Referring to FIG. 3, FIG. 3 shows a cross-section scheme of a light emitting diode package according one embodiments of the present disclosure. The basic structures in the embodiment is the same as the embodiments in FIG. 2, which includes a lead frame 310, a die bonding area 312 on a top surface of the lead frame 310, a light emitting diode chip 330 mounted on the die bonding area 312, and the light emitting diode chip 330 having a light emitting surface 332 on a top surface. A package body 320 covers the lead frame 310, and exposes part of the lead frame 310, the die bonding area 312 and the light emitting diode chip 330 mounted on the die bonding area 312. A top surface of the package body 320 has an opening 322, and an accommodation space 324 concaved from the opening 322. The accommodation space 324 includes a bottom surface 326 and a sidewall 328 surrounding the bottom surface 326. The light emitting diode chip 330 is on the bottom surface 326 of the accommodation space 324. The light emitting surface 332 of the light emitting diode chip 330 faces the opening 322 of the package body 320.

Referring to FIG. 3, the difference of the two embodiments in the FIG. 3 and FIG. 2 is two opaque spacers 340 disposed on the light emitting surface 332 of the light emitting diode chip 330 including a first opaque spacer 340A and a second opaque spacer 340B. The two opaque spacers 340 are vertically spaced and across disposed in the light emitting surface 332, dividing the accommodation space 324 into three chambers 350, including a first chamber 350A, a second chamber 350B, and a third chamber 350C. The all three chambers 350 expose part of the light emitting surface 332 of the light emitting diode chip 330. More particularly, in one embodiment of the present disclosure, the opaque spacers 340 extend from the bottom surface 326, along the sidewall 328, of the accommodation space 324 to the opening 322, separating a encapsulating glue 360 in the neighboring chambers 350, making the different kinds of encapsulating glues not be mixed. The opaque spacer 340 includes a silicone or an epoxy blended with a high reflectivity material. In which the high reflectivity material is selected from the group consisting of titanium dioxide, silicon dioxide, aluminum oxide and combinations thereof. The bottom surface 326 and the sidewall 328 also include the high reflectivity material.

Referring to FIG. 3, in one embodiments of the present disclosure, a first encapsulating glue 360A is filled into the first chamber 350A. The first encapsulating glue 360A includes a first wavelength converting material 370A. A second encapsulating glue 360B is filled into the second chamber 350B. The second encapsulating glue 360B includes a second wavelength converting material 370B. A third encapsulating glue 360C is filled into the third chamber 350C. The third encapsulating glue 360C includes a third wavelength converting material 370C. The first wavelength converting material 370A can convert the first light in the wavelength $\lambda_1$ emitted from the light emitting diode chip 330 into a second light in a wavelength $\lambda_2$. The second wavelength converting material 370B can convert the first light in the wavelength $\lambda_1$ emitted from the light emitting diode chip 330 into a third light in a wavelength $\lambda_3$. The third wavelength converting material 370C can convert the first light in the wavelength $\lambda_1$ emitted from the light emitting diode chip 330 into a fourth light in a wavelength $\lambda_4$. And the second light, the third light, and the fourth light can mix and form a white light. In one embodiment of the present disclosure, the light emitting diode chip 330 is an ultraviolet light emitting diode chip, the first wavelength converting material 370A is red phosphor, the second wavelength converting material 370B is green phosphor, and the third wavelength converting material 370C is blue phosphor. In one embodiment of the present disclosure, the light emitting diode chip 330 is a blue light emitting diode chip, red light emitting diode chip, green light emitting diode chip, or the ultraviolet light emitting diode chip. The wavelength converting material is phosphor, pigment, dye, and/or combinations thereof.

The light emitting diode package in FIGS. 1-3 are all schematic diagrams, in which the shape of the package body and the lead frame may change to comply the package structure or fabricating process needed, also may use on the ready-made light emitting diode package. The useful point of the present disclosure is by disposing the opaque spacer on the light emitting diode chip to divide the accommodation space into different chambers to fill the different wavelength converting material separately in to the different chambers. Making the exciting and converting process of the different light color may not be affected by the other kinds of wavelength converting material. The white light formed by mixing the different color lights therefore can increase the brightness and CRI value. Also, the number of the opaque spacers is not limited to one or two in the embodiments shown in figures, can further add for demand.

According to some embodiments of the present disclosure, N opaque spacers may be disposed on the light emitting diode chip, and vertically spaced and across disposed in the light emitting surface of the light emitting diode chip. Which divide the light emitting surface into N+1 parts and the accommodation space into N+1 chambers, in which each of the chambers exposes part of the light emitting surface of the light emitting diode chip. And N+1 encapsulating glues are filled into the N+1 chambers, separately. The $i^{th}$ encapsulating glue of the N+1 encapsulating glues includes a $i^{th}$ wavelength converting material. I and N are both natural numbers, and $1 \leq i \leq N+1$. For example, as embodiment in FIG. 2, N=1, as embodiment in FIG. 3, N=2. The light emitting diode chip may be a blue light emitting diode chip or an ultraviolet light emitting diode chip.

According to some embodiments of the present disclosure, wherein the $i^{th}$ wavelength converting material in the $i^{th}$ encapsulating glue and the $j^{th}$ wavelength converting material in the $j^{th}$ encapsulating glue belong to the same kind but different concentrations, or the $i^{th}$ wavelength converting material in the $i^{th}$ encapsulating glue is different from the $j^{th}$ wavelength converting material in the $j^{th}$ encapsulating glue, wherein j is a natural number, and $1 \leq j \leq N+1$, but $i \neq j$. And the $i^{th}$ and $j^{th}$ wavelength converting material are phosphor, pigment, dye, and/or combinations thereof.

Figure 4:
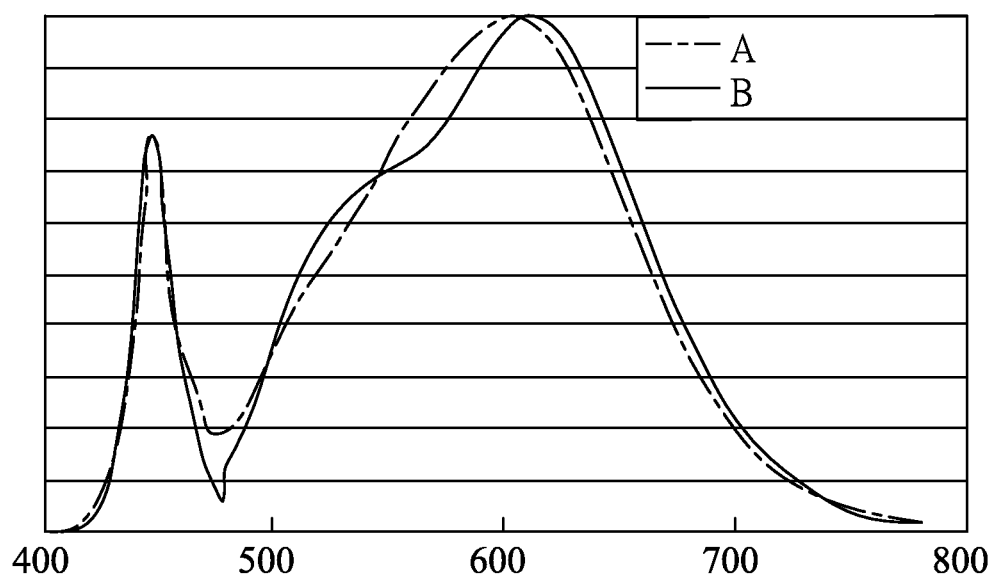
FIG. 4 is a photoluminescence diagram according to one embodiment of this disclosure.

Referring to FIG. 4, FIG. 4 is a photoluminescence diagram according to one embodiment of this disclosure. As shown in FIG. 4, line B depicts a photoluminescence experiment result of two phosphors filled into two different chambers, separately, and line A depicts a photoluminescence experiment result of two phosphors mixed and filled into one accommodation space. The line B has more turning points than line A. The differences of the turning points shows that the white light formed in line B is much similar to a white light mixed by two light sources, therefore has better CRI value. Table 1 is the average CRI value averaged from 8 experiment results.

TABLE 1

|  | R1 | R2 | R3 | R4 | R5 | R6 | R7 | R8 | CRI |
|---|---|---|---|---|---|---|---|---|---|
| Experiment A | 80.85 | 88.65 | 94.33 | 80.75 | 80.23 | 84.03 | 85.87 | 65.33 | 82.50 |
| Experiment B | 88.30 | 90.71 | 91.73 | 88.77 | 87.27 | 87.70 | 89.37 | 75.50 | 87.42 |

The experiment data in table 1 is in consistent with FIG. 4. The phosphors separating light emitting diode package according to various embodiments of the present disclosure has better CRI value in comparison with the package mixing two phosphors in one accommodation space.

According to various embodiments of the present disclosure, the light emitting diode package has following advantages including the CRI value and the brightness of the formed white light can be increased by separating different wavelength converting material to avoid the energy absorbance effect between different kinds of the wavelength converting material. Also the light emitting diode package in the present disclosure only include one light emitting diode chip, not only can save the cost of other light emitting diode chips, but also can enhance the convenience of fabricating process. No matter what the package substrate is, only add an opaque spacer on the light emitting diode chip can form the same package according to the present disclosure. Therefore no new mold need to make and no limitation of the shape of the opaque spacer. Different kinds of wavelength converting material can be filled into different chambers in one process. The provided light emitting diode package is not only easy to fabricate, but also can lower the cost. The light emitting diode package can also reapply by replacing the wavelength converting material in the package. The brightness and the CRI value can both be enhanced by the provided light emitting diode structure.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light emitting diode package, comprising:
a lead frame comprising a die bonding area;
a package body covering the lead frame and exposing part of the lead frame, wherein a top surface of the package body has an opening and an accommodation space concaved from the opening, wherein the accommodation space comprises a bottom surface and a sidewall surrounding the bottom surface and exposing the die bonding area of the lead frame on the bottom surface of the accommodation space;
a light emitting diode chip emitting a first light in a wavelength $\lambda_1$ mounted on the die bonding area, and the light emitting diode chip having a light emitting surface facing the opening;
N opaque spacers vertically spaced and across disposed in the light emitting surface of the light emitting diode chip, dividing the light emitting surface into N+1 parts and dividing the accommodation space into N+1 chambers, wherein each of the chambers exposes a part of the light emitting surface of the light emitting diode chip; and
N+1 encapsulating glues separately filling into each of the chamber, and the $i^{th}$ encapsulating glue comprising an $i^{th}$ wavelength converting material,
wherein i and N are both natural numbers, and $1 \leq i \leq N+1$.

2. The light emitting diode package of claim 1, wherein the $i^{th}$ wavelength converting material in the $i^{th}$ encapsulating glue and the $j^{th}$ wavelength converting material in the $j^{th}$ encapsulating glue belong to the same kind but different concentrations, wherein j is a natural number, and $1 \leq j \leq N+1$, but $i \neq j$.

3. The light emitting diode package of claim 1, wherein the $i^{th}$ wavelength converting material in the $i^{th}$ encapsulating glue is different from a $j^{th}$ wavelength converting material in a $j^{th}$ encapsulating glue, wherein j is a natural number, and $1 \leq j \leq N+1$, but $i \neq j$.

4. The light emitting diode package of claim 1, wherein each of the opaque spacer extends from the bottom surface of the accommodation space to the opening along the sidewall, such that the encapsulating glue in the neighboring chambers is not mixed to each other.

5. The light emitting diode package of claim 1, wherein the first light emitted by the light emitting diode chip, after passing through the $i^{th}$ chamber, is converted to a i+1th light in a wavelength i+1, in which $\lambda i+1 > \lambda_1$, by the $i^{th}$ wavelength converting material in the encapsulating glue in the $i^{th}$ chamber, to emit a plurality of fluorescence which is configured to be mixed to a white light.

6. The light emitting diode package of claim 1, wherein the light emitting diode chip is an ultraviolet light emitting diode chip or a blue light emitting diode chip.

7. The light emitting diode package of claim 6, the wavelength converting material is a phosphor, pigment, dye, or combinations thereof.

8. The light emitting diode package of claim 1, wherein the opaque spacers comprises a silicone or an epoxy blended with the high reflectivity material.

9. The light emitting diode package of claim 8, wherein the bottom surface and the sidewall also comprise a high reflectivity material.

10. The light emitting diode package of claim 9, wherein the high reflectivity material is selected from the group consisting of titanium dioxide, silicon dioxide, aluminum oxide and combinations thereof.

\* \* \* \* \*